United States Patent
Kimura

(10) Patent No.: US 7,612,698 B2
(45) Date of Patent: Nov. 3, 2009

(54) TEST APPARATUS, MANUFACTURING METHOD, AND TEST METHOD

(75) Inventor: Hiroki Kimura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/145,510

(22) Filed: Jun. 25, 2008

(65) Prior Publication Data

US 2009/0033528 A1   Feb. 5, 2009

(30) Foreign Application Priority Data

Aug. 3, 2007   (JP) .............................. 2007-203519

(51) Int. Cl.
*H03M 1/10* (2006.01)
(52) U.S. Cl. ........................ 341/120; 714/736; 714/724
(58) Field of Classification Search ......... 341/120–155; 714/736, 724
See application file for complete search history.

(56) References Cited

U.S. PATENT DOCUMENTS

| | | | | | |
|---|---|---|---|---|---|
| 4,620,302 | A | * | 10/1986 | Binoeder et al. | 714/736 |
| 6,057,679 | A | * | 5/2000 | Slizynski et al. | 714/724 |
| 6,324,665 | B1 | * | 11/2001 | Fay | 714/736 |
| 7,571,363 | B2 | * | 8/2009 | Wallace et al. | 714/724 |
| 2005/0219107 | A1 | * | 10/2005 | Guidry | 341/163 |
| 2009/0027041 | A1 | * | 1/2009 | Kimura | 324/123 R |

FOREIGN PATENT DOCUMENTS

JP   7-321654   12/1995

\* cited by examiner

*Primary Examiner*—Lam T Mai
(74) *Attorney, Agent, or Firm*—Jianq Chyun IP Office

(57) ABSTRACT

There is provided a test apparatus for testing a device under test, the test apparatus including: a test signal supplying section that supplies a digital input signal for testing purposes, to the device under test; a reference signal output section that outputs an analogue reference signal in accordance with the digital input signal; a difference obtaining section that outputs an analogue difference signal representing a difference between the analogue reference signal and an analogue output signal outputted by the device under test in accordance with the digital input signal; and a determining section that determines whether the analogue output signal shows a defect or not based on the analogue difference signal.

11 Claims, 13 Drawing Sheets

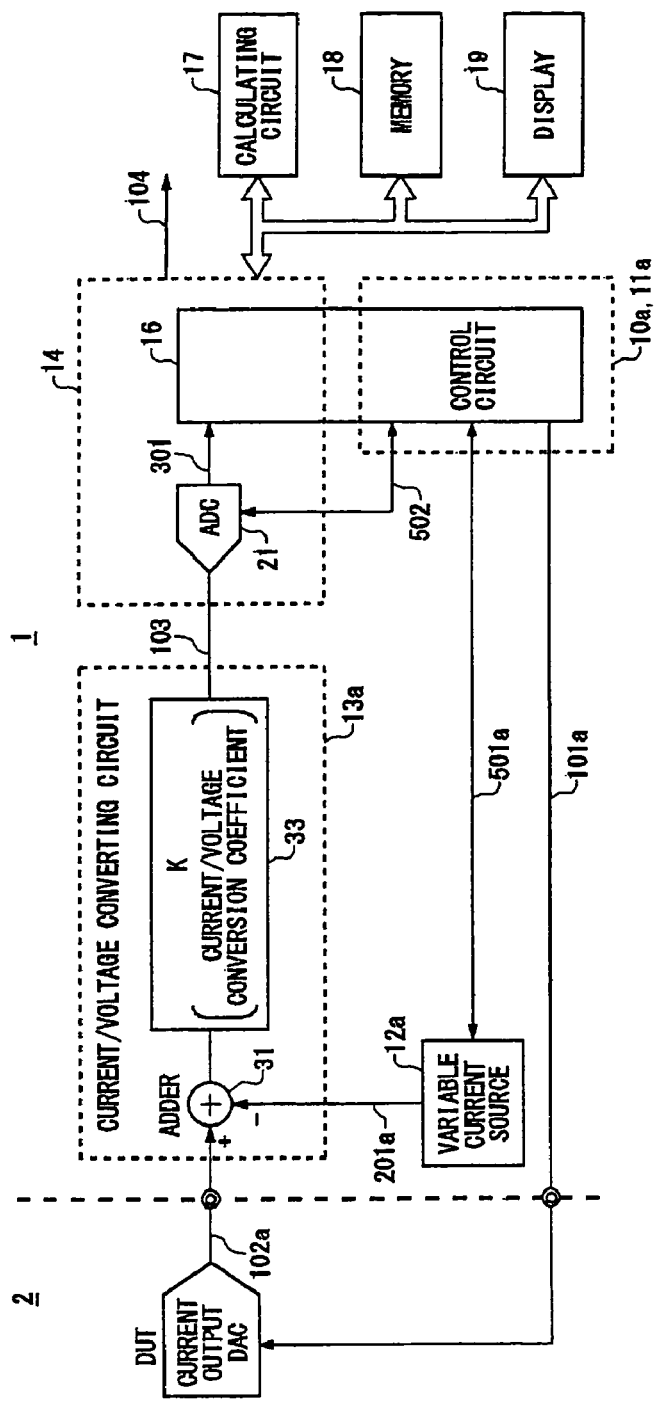
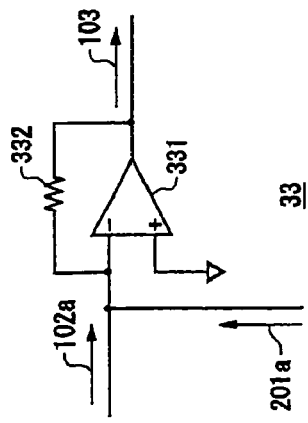
FIG. 6A
FIG. 6B

TEST APPARATUS, MANUFACTURING METHOD, AND TEST METHOD

CROSS REFERENCE TO RELATED APPLICATION

The present application claims priority from a Japanese Patent Application No. 2007-203519 filed on Aug. 3, 2007, the contents of which are incorporated herein by reference.

BACKGROUND

1. Technical Field

The present invention relates to a test apparatus, a manufacturing method, and a test method. In particular, the present invention relates to a test apparatus for determining a test result of a device under test after converting the test result with an analogue-to-digital converter (AD converter).

2. Related Art

For the purpose of testing a device under test having a high resolution 4digital-to-analogue converter (DA converter), Japanese Patent Application Publication No. 7-321654, for example, discloses a test apparatus having an AD converter with a resolution equal to or higher than the resolution of the DA converter in the device under test.

For testing such a device under test having a high resolution DA converter, a test apparatus has to be equipped with an AD converter having a resolution equal to or higher than the resolution of the DA converter. An AD converter having a high resolution, however, has a complicated structure. If a test apparatus incorporates such a high resolution AD converter, the manufacturing of the test apparatus becomes difficult, thereby raising the manufacturing cost.

SUMMARY

Therefore, it is an object of an aspect of the innovations herein to provide a test apparatus, a manufacturing method, and a test method that are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary test apparatus for testing a device under test includes: a test signal supplying section that supplies a digital input signal for testing purposes, to the device under test; a reference signal output section that outputs an analogue reference signal in accordance with the digital input signal; a difference obtaining section that outputs an analogue difference signal representing a difference between the analogue reference signal and an analogue output signal outputted by the device under test in accordance with the digital input signal; and a determining section that determines whether the analogue output signal shows a defect or not based on the analogue difference signal.

According to the second aspect related to the innovations herein, one exemplary manufacturing method includes: manufacturing a device under test; and selecting the manufactured device under test by testing the device under test using a test apparatus for testing a device under test, the test apparatus including: a test signal supplying section that supplies a digital input signal for testing purposes, to the device under test; a reference signal output section that outputs an analogue reference signal in accordance with the digital input signal; a difference obtaining section that outputs an analogue difference signal representing a difference between the analogue reference signal and an analogue output signal outputted by the device under test in accordance with the digital input signal; and a determining section that determines whether the analogue output signal shows a defect or not based on the analogue difference signal.

According to the third aspect related to the innovations herein, one exemplary test method for testing a device under test includes: supplying a digital input signal for testing purposes, to the device under test; outputting an analogue reference signal in accordance with the digital input signal; outputting an analogue difference signal representing a difference between the analogue reference signal and an analogue output signal outputted by the device under test in accordance with the digital input signal; and determining whether the analogue output signal shows a defect or not based on the analogue difference signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 6A shows a first modification example of the test apparatus 1 according to the present embodiment. FIG. 6B shows an exemplary configuration of the current/voltage converting circuit 33 included in the difference obtaining section 13a.

DESCRIPTION OF EXEMPLARY EMBODIMENTS

Figure 1:
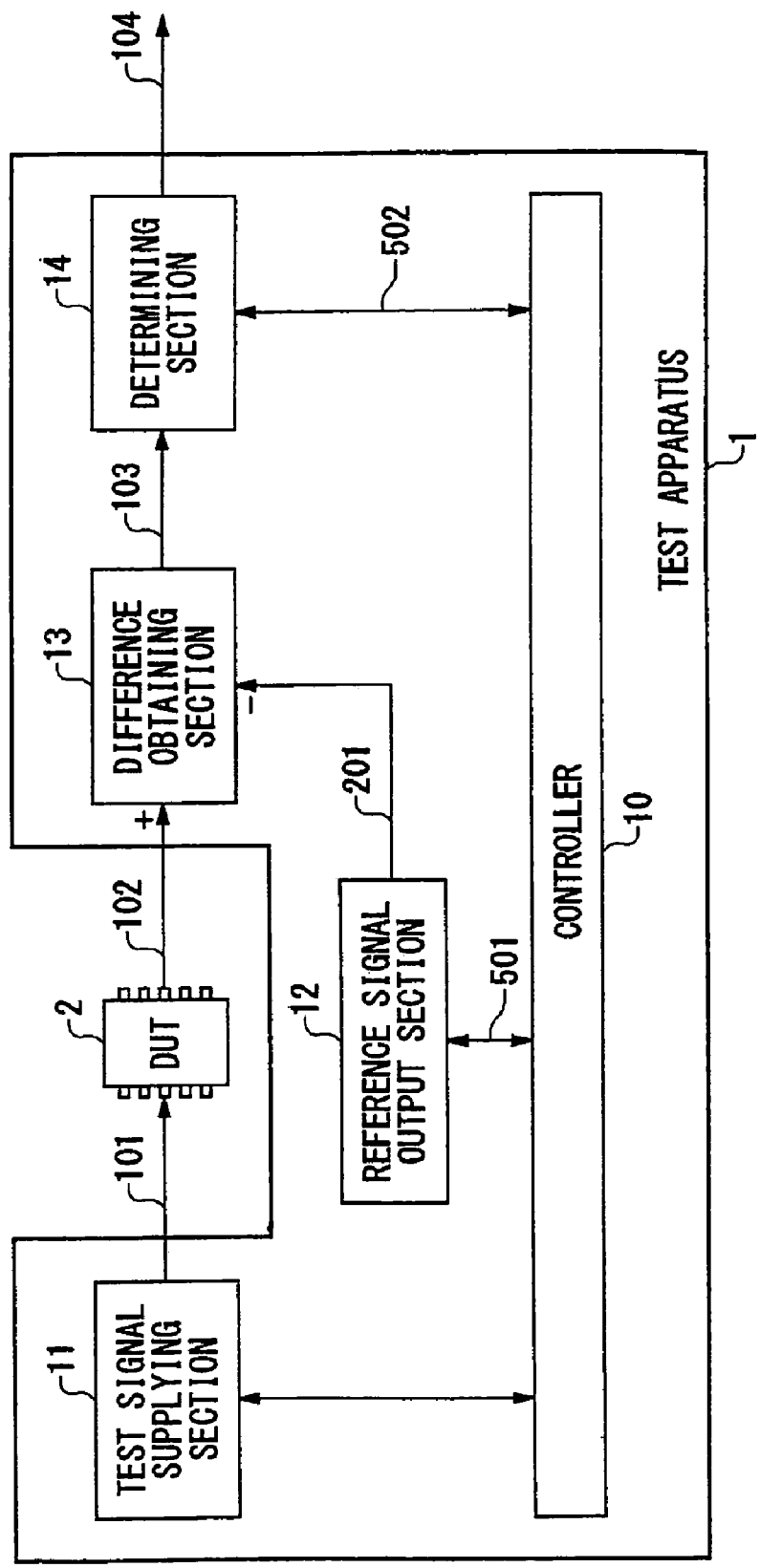
FIG. 1 shows an exemplary configuration of a test apparatus 1 according to the present embodiment.

Some aspects of the invention will now be described based on the embodiments, which do not intend to limit the scope of the present invention, but exemplify the invention. All of the features and the combinations thereof described in the embodiment are not necessarily essential to the invention. The same or similar elements may occasionally be provided with the same reference numeral, with the related description thereof omitted.

FIG. 1 shows an exemplary configuration of a test apparatus 1 according to the present embodiment. The test apparatus 1 according to the present embodiment tests a device under test 2. More specifically, the test apparatus 1 is capable of testing an analogue output signal 102 from the device under test 2, which includes the DA converter, with the use of an AD converter of relatively low cost. An example of such an AD converter of relatively low cost is an AD converter having a lower resolution, a narrower measurement range, and/or a smaller bit, than the DA converter included in the device under test 2.

The test apparatus 1 includes a controller 10, a test signal supplying section 11, a reference signal output section 12, a difference obtaining section 13, and a determining section 14. The controller 10 may include, for example, a microprocessor, a memory, and the like, to control the operation of each section in the test apparatus 1. The controller 10 also generates a digital input signal 101 for testing purposes, and supplies the digital input signal 101 to the test signal supplying section 11. The test signal supplying section 11 is controlled by the controller 10 to supply the digital input signal 101 to the device under test 2. The test signal supplying section 11 sequentially supplies a plurality of digital input signals 101 to the device under test 2. The digital input signal 101 may be such that each bit is sequentially set to 1 while the other bits are set to 0.

In the present embodiment, the controller 10 supplies, to the reference signal output section 12, expected values respectively of a plurality of analogue output signals 102, in the form of an output section control signal 501, the plurality of analogue output signals 102 being outputted from the device under test 2 according to a plurality of digital input signals 101 during a test. The controller 10 also supplies expected values respectively of the analogue output signals 102 to the determining section 14, in the form of a determining section control signal 502. The device under test 2 converts a digital input signal 101 input by the test signal supplying section 11 into an analogue output signal 102 by means of the DA converter, and outputs the analogue output signal 102 to the difference obtaining section 13. The DA converter of the present embodiment outputs a converted output as a voltage value, and so the analogue output signal 102 of the present embodiment is a voltage output value.

The reference signal output section 12 generates an analogue reference signal 201 in accordance with the digital input signal 101 for testing purposes, based on expected values respectively of analogue output signals 102 in the output section control signal 501 inputted from the controller 10. The configuration of the reference signal output section 12 will be detailed later with reference to FIG. 2.

The difference obtaining section 13 receives an analogue output signal 102 outputted from the device under test 2 according to the digital input signal 101 for testing purposes, and an analogue reference signal 201 from the reference signal output section 12. The difference obtaining section 13 generates an analogue difference signal 103 representing the difference between the analogue output signal 102 and the analogue reference signal 201, and outputs the analogue difference signal 103. The difference obtaining section 13 will be detailed later with reference to FIG. 3.

The determining section 14 receives the analogue difference signal 103 from the difference obtaining section 13, as well as the expected values respectively of the analogue output signals 102 from the controller 10 in the form of the determining section control signal 502. The determining section 14 determines whether the analogue output signals 102 outputted from the device under test 2 is defective or not, based on the received analogue difference signal 103 and the expected values respectively of the analogue output signals 102. The determining section 14 will be detailed later with reference to FIG. 4.

According to the described configurations, the test apparatus 1 can measure an analogue difference signal 103 representing the difference between an analogue output signal 102 and an analogue reference signal 201, by means of an AD converter or the like having a resolution equal to or smaller than the resolution of the DA converter included in the device under test 2. With the measurement result, the test apparatus 1 is able to determine whether an analogue output signal outputted from the device under test 2 is defective or not.

Figure 2:
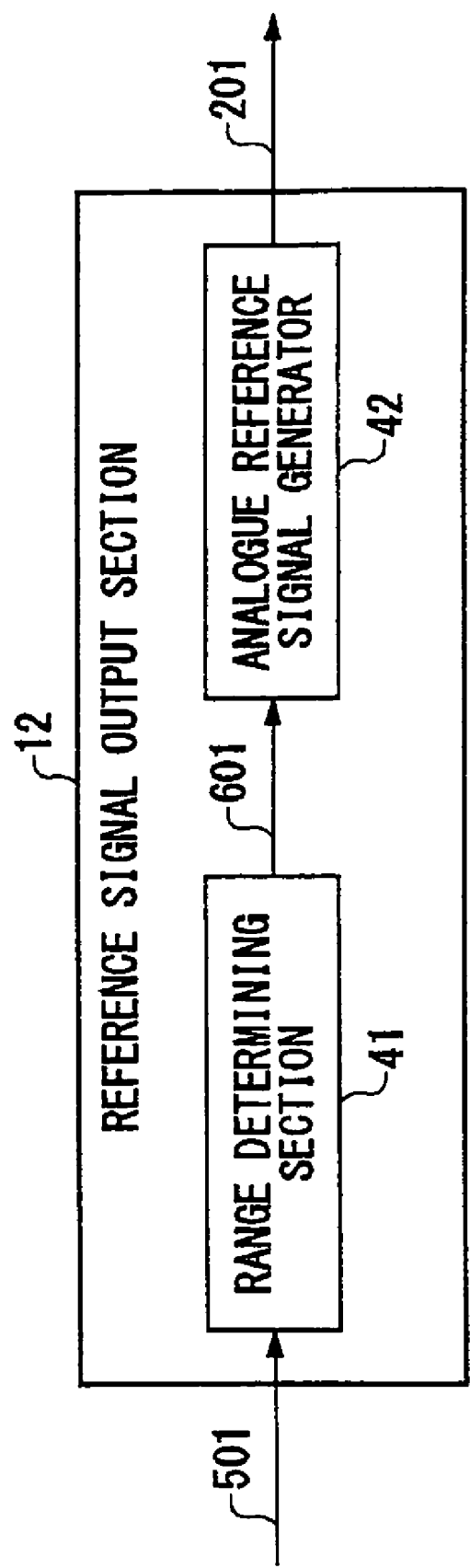
FIG. 2 shows an exemplary configuration of a reference signal output section 12 according to the present embodiment.

FIG. 2 shows an exemplary configuration of the reference signal output section 12 according to the present embodiment. The reference signal output section 12 includes a range determining section 41 and an analogue reference signal generator 42. The range determining section 41 determines in which of a plurality of pre-set division ranges respective expected values of the test result output of the device under test 2 are included, the expected values included in the output section control signal 501 received from the controller 10, and outputs a range determining signal 601.

The plurality of division ranges may be ranges resulting from dividing the range of the value of the digital input signal. The division ranges will be detailed later with reference to FIGS. 5A and 5B. The analogue reference signal generator 42 outputs an analogue reference signal 201 determined for the corresponding division range, from the range determining signal 601.

Figure 3:
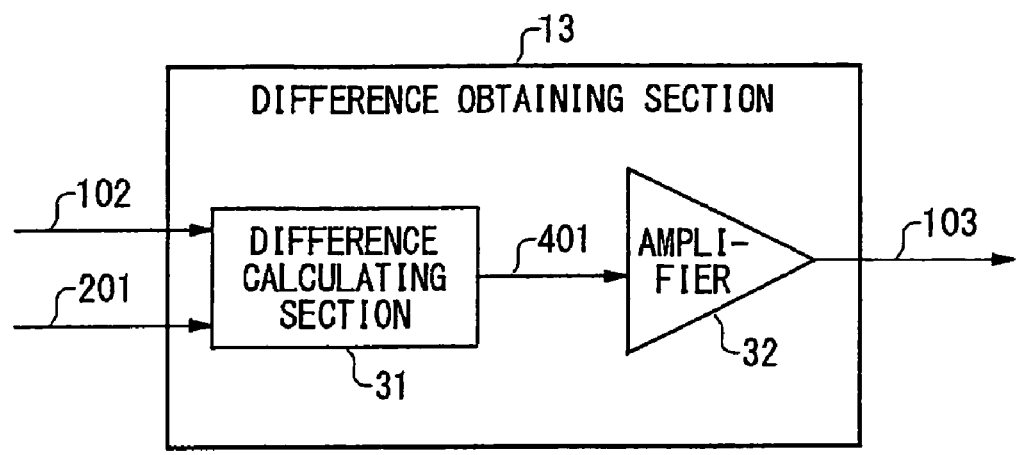
FIG. 3 shows an exemplary output of a reference signal output section 12 and a difference obtaining section 13 according to the present embodiment.

FIG. 3 shows a difference obtaining section 13 according to the present embodiment. The difference obtaining section 13 includes a difference calculating section 31 and an amplifier 32. The difference calculating section 31 calculates a difference between an analogue output signal 102 from the device under test 2 and an analogue reference signal 201 from the reference signal output section 12, and outputs the calculation result as an analogue difference signal 401. As an example, the difference obtaining section 13 may subtract the analogue reference signal 201 from the analogue output signal 102, and outputs the subtraction result as an analogue difference signal 401.

Next, the amplifier 32 amplifies the analogue difference signal 401 inputted from the difference calculating section 31a predetermined number of times, and outputs the amplified analogue difference signal 103. For example, when the amplifier 32 outputs an analogue difference signal 103 obtained by amplifying the voltage of the analogue difference signal 401 two times, the fluctuation range of the analogue difference signal 103 will be twice the fluctuation range of the voltage of the analogue output signal 102. Then, the determining section 14 in a later stage is able to obtain the value of the analogue output signal reflecting the level of amplification of the analogue difference signal 103 and the decrease in the voltage value of the analogue reference signal 201. This realizes determination of an analogue output signal 102 with the use of an AD converter or the like having a relatively low resolution.

Figure 4:
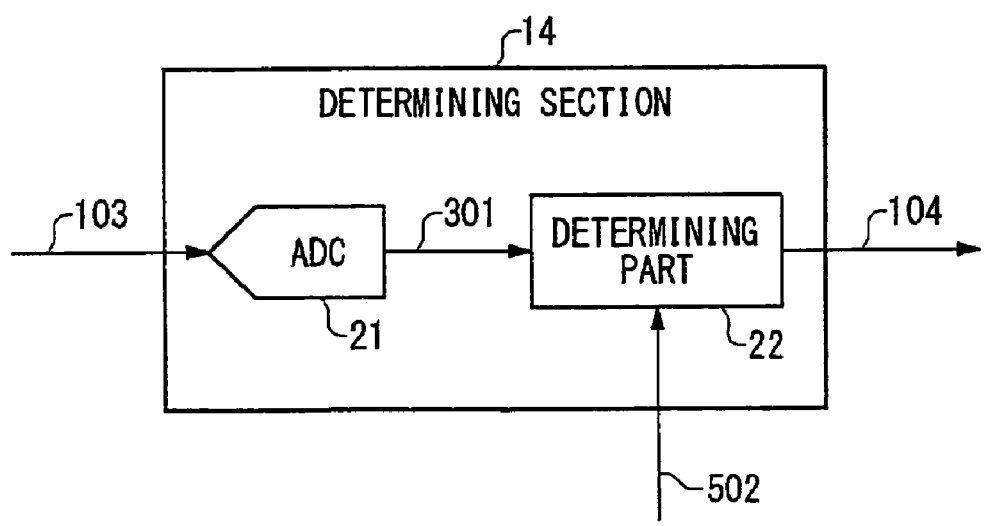
FIG. 4 shows an exemplary configuration of the difference obtaining section 13 according to the present embodiment.

FIG. 4 shows an exemplary configuration of the determining section 14 according to the present embodiment. The determining section 14 includes an AD converter 21 and a determining part 22. The AD converter 21 converts an analogue difference signal 103 inputted from the difference obtaining section 13 into a digital difference signal 301, and outputs the digital difference signal 301 to the determining part 22. The present embodiment may use an AD converter 21 that has a resolution equal to or smaller than the resolution of the DA converter included in the device under test 2. The determining part 22 determines whether an analogue output signal 102 outputted from the device under test 2 is defective or not, based on the voltage value of the analogue difference signal 103 digitalized by the digital difference signal 301 inputted from the AD converter 21, and the expected values respectively of the analogue output signals 102 received as the determining section control signal 502 from the controller 10, and outputs the determination output 104.

The determining section 14 of the present embodiment can obtain the value of an analogue output signal 102 outputted from the device under test 2 by Expression 1.

$$Vo = Va + Vm/G \quad (1)$$

Here, Vo represents the voltage value of the analogue output signal 102, Va represents the voltage value of the analogue reference signal 201, Vm represents the voltage value of the analogue difference signal 103, and G represents the level of amplification by the amplifier 32.

The determining part 22 determines that the device under test 2 is defective when the digital difference signal 301 falls out of an error range with respect to at least one of the plurality of digital input signals 101 supplied from the test signal supplying section 11 to the device under test 2. The determining part 22 is able to receive a setting of a predetermined range based on a required specification or the like of the device under test 2, for example, as the error range of the digital difference signal 301 outputted from the AD converter 21.

Figure 5A:
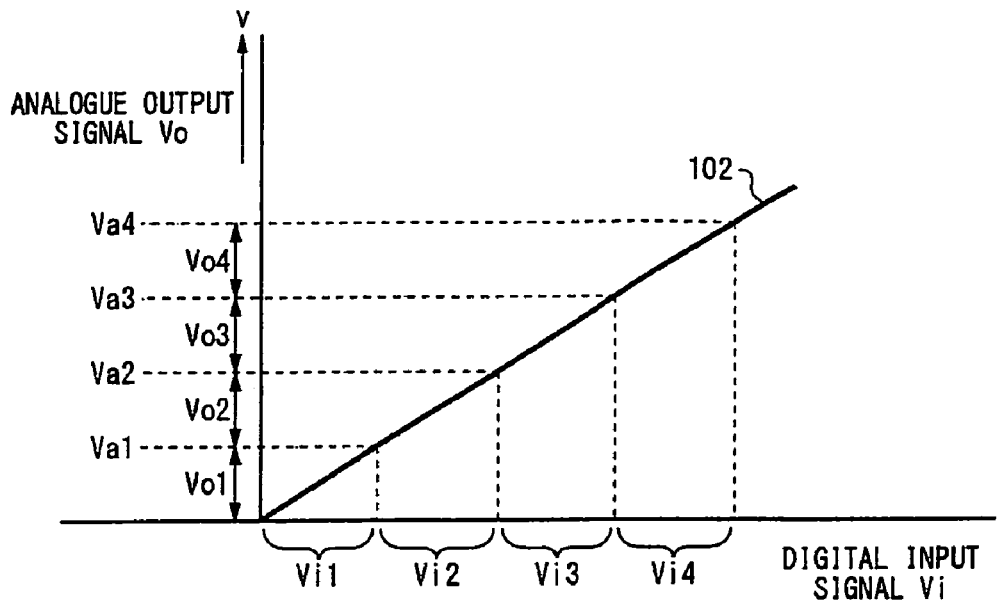
FIGS. 5A and 5B show an exemplary output of the reference signal output section 12 and the difference obtaining section 13 according to the present embodiment.
Figure 5B:
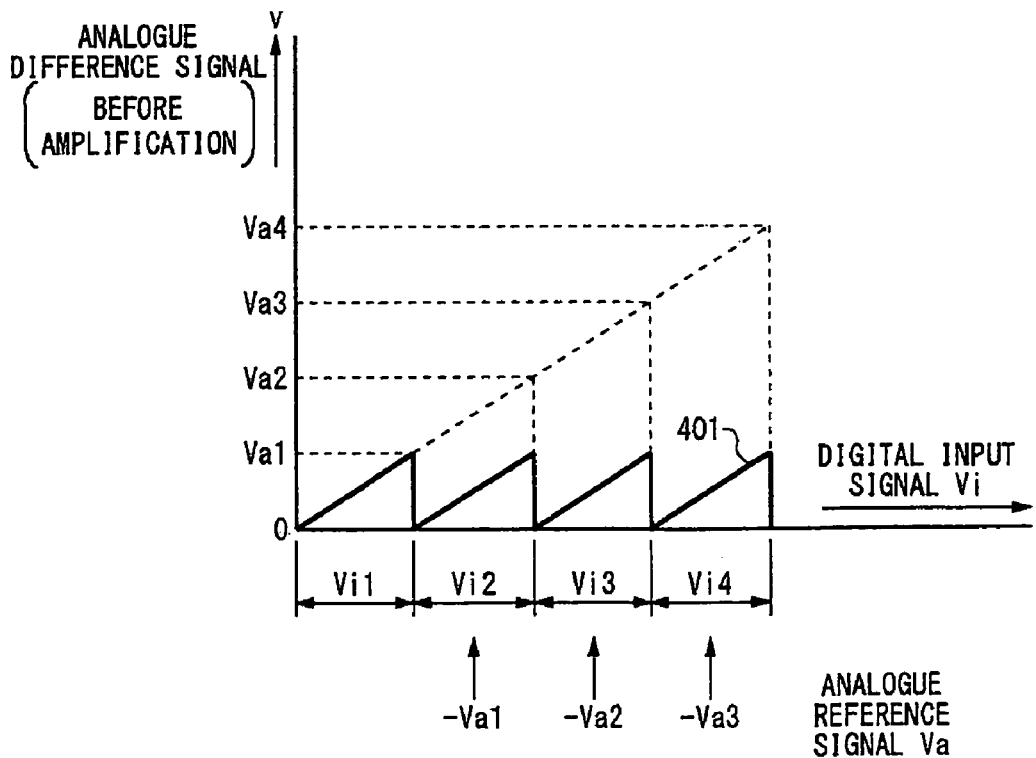

FIGS. 5A and 5B show an exemplary output of the reference signal output section 12 and the difference obtaining section 13 according to the present embodiment. FIG. 5A shows the value of the digital input signal 101 on the horizontal axis, and the voltage V of the analogue output signal 102 on the vertical axis. The range of the value of the digital input signal 101 is divided into ranges Vi1, Vi2, Vi3, and Vi4. These value ranges of the digital input signal 101 may have the same width as each other or different widths from each other.

The value ranges of the analogue output signal 102 outputted from the device under test 2 are such as Vo1 being 0V-Va1, Vo2 being Va1-Va2, Vo3 being Va2-Va3, and Vo4 from Va3-Va4, respectively corresponding to the value ranges of the digital input signal 101. In this case, these value ranges of the analogue output signal 102 will ideally have the same widths as each other. For example, when the value range of the digital input signal 101 is vi1, the value range of the analogue output signal 102 outputted from an ideal device under test 2 will be Vo1.

The analogue reference signal generator 42 outputs an analogue reference signal 201 corresponding to the range in which the value of the digital input signal 101 is included. Specifically, the analogue reference signal generator 42 may output the value of the analogue reference signal to be outputted from the device under test 2 according to the lower limit, the upper limit, the intermediate value, or the like of the digital input signal 101. The analogue reference signal generator 42 may output the value obtained by subtracting a predetermined margin from the lower limit of the digital input signal 101, or the value obtained by adding a predetermined margin to the upper limit, as the analogue reference signal 201. In the present embodiment, the analogue reference signal 201 outputted from the reference signal output section 12 will be 0V when the value range of the digital input signal 101 is Vi1, Va1 when the value range of the digital input signal 101 is Vi2, Va2 when the value range of the digital input signal 101 is Vi3, and Va3 when the value range of the digital input signal 101 is Vi4.

FIG. 5B shows the value of the digital input signal 101 on the horizontal axis, and the voltage V of the analogue difference signal 401 corresponding to the analogue output signal 102 of FIG. 5A on the vertical axis. In the present embodiment, the graph of the analogue difference signal 401 outputted from the difference calculating section 31 will look like a saw, where the analogue difference signal 401 increases in accordance with the increase in digital input signal 101, within each value range of the digital input signal 101.

The amplifier 32 amplifies the analogue difference signal 401 outputted from the difference calculating section 31. The amplifier 32 outputs the amplified analogue difference signal 103 to the determining section 14. As shown in Expression 1, the determining part 22 of the determining section 14 obtains the value Vo of the analogue output signal 102, using the level of amplification G of the analogue difference signal 103, the voltage value Va of the analogue reference signal 201, and the voltage value Vm of the analogue difference signal 103.

Next, the determining part 22 determines whether the device under test 2 is defective or not, depending on whether the value Vo of the analogue output signal 102 falls within a predetermined error range with respect to each expected value of the analogue output signal 102 received from the controller 10, and outputs the determination result as a determination output 104. In this case, for example, the determining part 22 may determine whether the value of the analogue output signal 102 falls within a predetermined error range with respect to the ideal output voltage value (expected value) in accordance with the digital input signal 101 inputted to the device under test 2. In this way, according to the present embodiment, the analogue output signal 102 outputted from the device under test 2 can be judged by using an AD converter 21 or the like having a lower resolution than the resolution of the DA converter included in the device under test 2.

FIG. 6A shows a first modification example of the test apparatus 1 according to the present embodiment. In the test apparatus 1 according to the first modification example, the parts having the same function and configuration as those of the test apparatus 1 shown in FIGS. 1 through 5 are provided with the same reference numerals, with the related description omitted except for the differences therebetween. The DA converter in the first modification example outputs the converted output as a current value, and so the analogue output signal 102 of the first modification example will be a current output value.

The test apparatus 1 according to the first modification example includes a reference signal output section 12a, a difference calculating section 31, a current/voltage converting circuit 33, an AD converter 21, a control circuit 16, a calculating circuit 17, a memory 18, and a display 19. The reference signal output section 12a may be a variable current source controllable by an output section control signal 501a from the controller 10a. In the test apparatus 1 according to the first modification example, the output section control signal 501a includes an expected value of the test result output of the device under test 2 described above. The control circuit 16 has the function of the determining part 22 of the determining section 14, the function of the controller 10a corresponding to the controller 10, and the function of the test signal supplying section 11a corresponding to the test signal supplying section 11.

The control circuit 16 sequentially generates digital input signals 101a to be supplied to the device under test 2. The control circuit 16 may also determine whether the device under test 2 is defective or not, by comparing the determination output 104 with the expected value. The calculating circuit 17 performs a calculation necessary for the control circuit, by being controlled by the control circuit 16. The control circuit 16 and the calculating circuit 17 may be a microprocessor, for example. The memory 18 memorizes a program to be executed by the control circuit 16 or the like, and data used by the control circuit 16 or the like. Examples of the program and data are a parameter for generating a digital input signal 101a and data such as an expected value of the digital difference signal 301. The display 19 may, for example, display a test result of the device under test 2 based on the determination output 104. In addition, when the contents of the digital input signal 101 for the device under test 2 are set to the test apparatus 1, the display 19 may display the set contents.

FIG. 6B shows an exemplary configuration of the current/voltage converting circuit 33 included in a difference obtaining section 13a. The current/voltage converting circuit 33 includes a calculation amplifier 331 and a resistance 332. The inversion input terminal of the calculation amplifier 331 is connected to the junction between the analogue output signal 102a and the analogue reference signal 201a. The noninversion input terminal of the calculation amplifier 331 is grounded.

The calculation amplifier 331 outputs an analogue difference signal 103 having a voltage with a polarity opposite the polarity of the potential of the junction between the analogue output signal 102a and the analogue reference signal 201a, the voltage being amplified at a predetermined magnification ratio. The resistance 332 is connected to send a negative feedback to the calculation amplifier 331. The other configurations may be the same as those of the embodiment shown in FIG. 1.

The determining section 14 in the present modification example can obtain the value of the analogue output signal 102a outputted from the device under test 2 by Expression 2.

$$Io = Ia + Vm/K \qquad (2)$$

Here, Io represents the current value of the analogue output signal 102a, Ia represents the current value of the analogue reference signal 201a, Vm represents the voltage value of the analogue difference signal 103, and K represents the current/voltage conversion coefficient of the current/voltage converting circuit 33. In this way, the test apparatus 1 according to the present modification example is able to determine the analogue output signal 102 outputted from the device under test 2, using an AD converter 21 having a resolution that is the same as or lower than the resolution of the DA converter included in the device under test 2, a conversion possible range that is the same as or smaller than the conversion possible range of the DA converter included in the device under test 2, or a bit that is the same as or smaller than the bit of the DA converter included in the device under test 2, even when the test result output from the device under test 2 is a current value.

Figure 7:
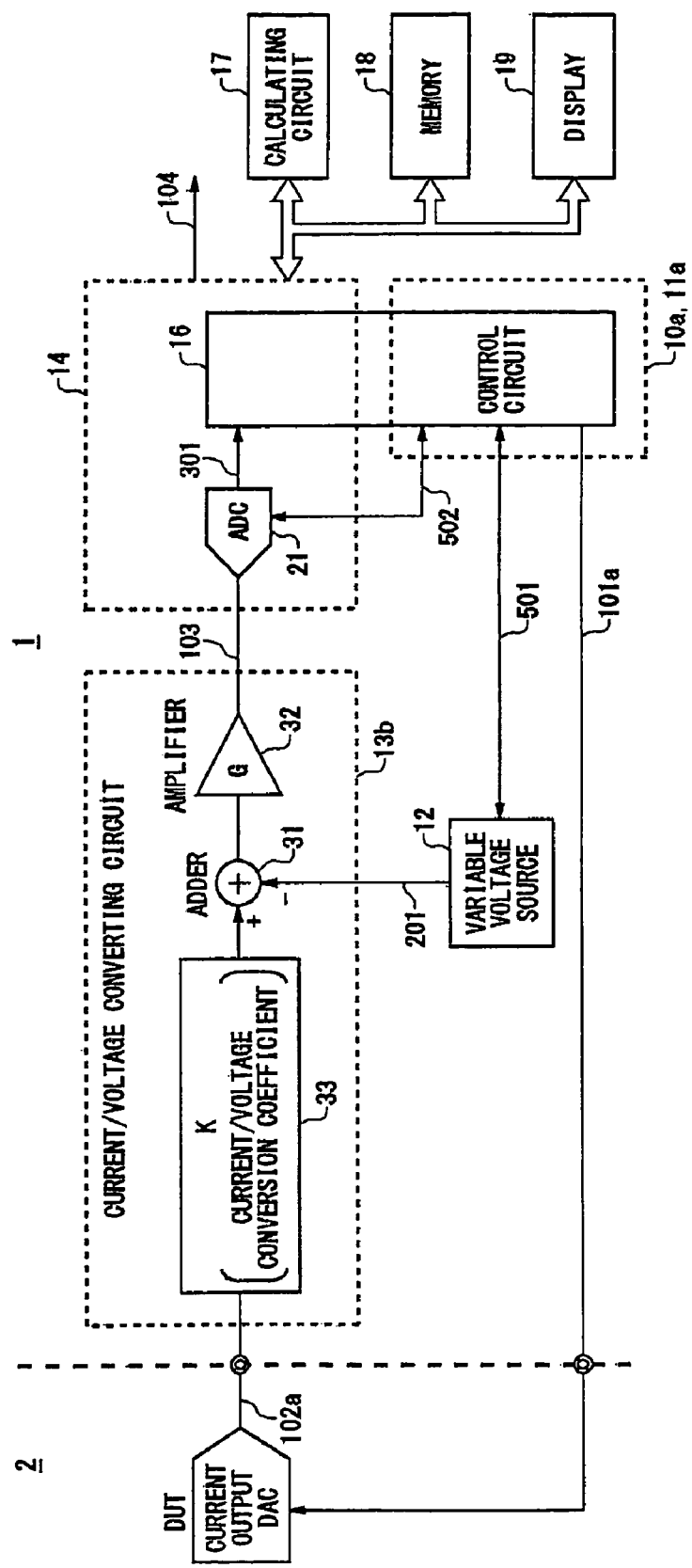
FIG. 7 shows a second modification example of the test apparatus 1 according to the present embodiment.

FIG. 7 shows a second modification example of the test apparatus 1 according to the present embodiment. In the test apparatus 1 according to the second modification example, the parts having the same function and configuration as those of the test apparatus 1 shown in FIG. 6 are provided with the same reference numerals, with the related description omitted except for the differences therebetween. In the present modification example, too, the control circuit 16 has the function of the determining part 22 of the determining section 14, the function of the controller 10a corresponding to the controller 10, and the function of the test signal supplying section 11a corresponding to the test signal supplying section 11. In addition, the calculating circuit 17, the memory 18, the display 19, and the current/voltage converting circuit 33 may be the same as their counterparts in the first modification example. The other functions and configurations may be the same as those of the first modification example shown in FIG. 6. The DA converter in the second modification example outputs the converted output as a current value, and so the analogue output signal 102 of the second modification example will be a current output value.

The determining section 14 in the present modification example can obtain the analogue output signal 102 outputted from the device under test 2 by Expression 3.

$$Io = (Va + Vm/G)/K \qquad (3)$$

Here, Io represents the current value of the analogue output signal 102a, Va represents the voltage value of the analogue reference signal 201, Vm represents the voltage value of the analogue difference signal 103, G represents the level of amplification by the amplifier 32, and K represents the current/voltage conversion coefficient of the current/voltage converting circuit 33. In this way, the test apparatus 1 according to the present modification example is able to determine the analogue output signal 102 outputted from the device under test 2, using an AD converter 21 having a resolution that is the same as or lower than the resolution of the DA converter included in the device under test 2, a conversion possible range that is the same as or smaller than the conversion possible range of the DA converter included in the device under test 2, or a bit that is the same as or smaller than the bit of the DA converter included in the device under test 2, even when the test result output from the device under test 2 is a current value and the reference signal output section 12 is a variable voltage source.

Figure 8:
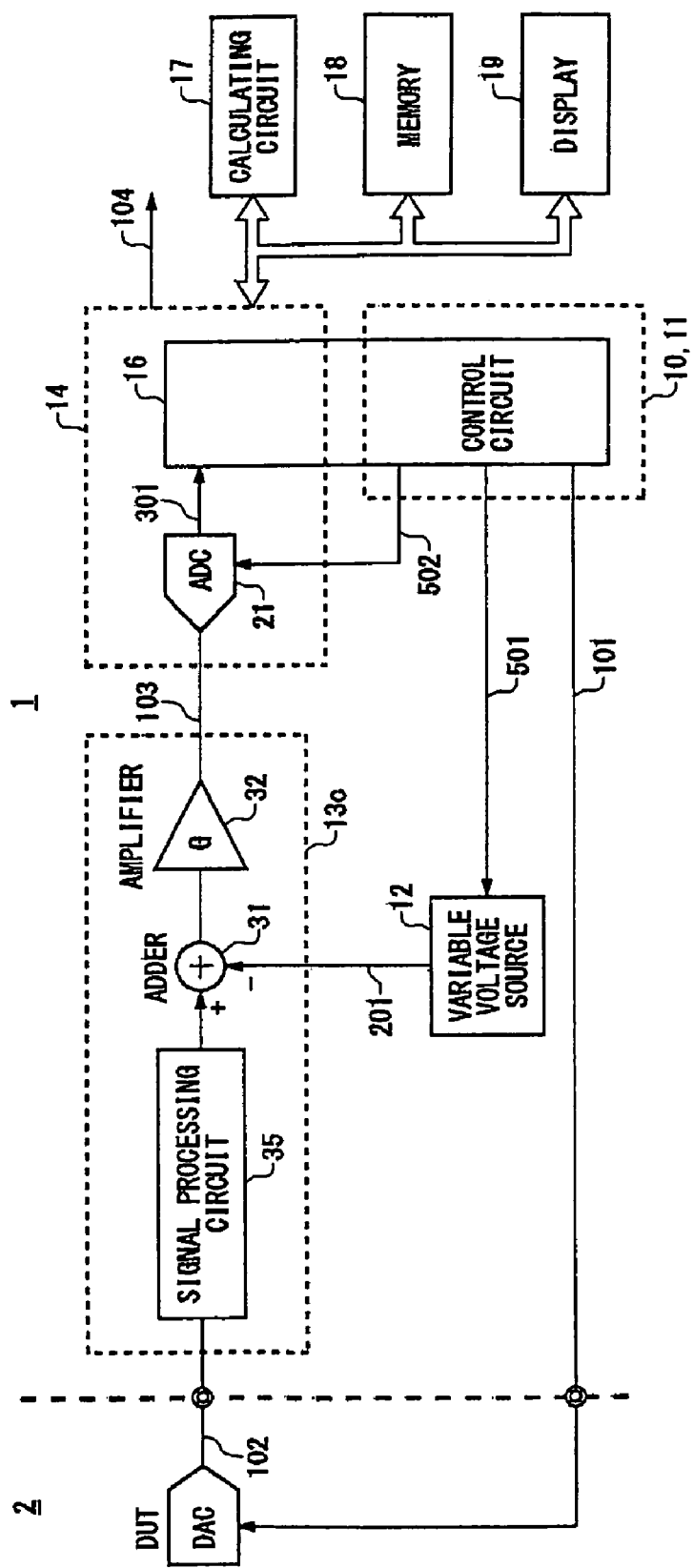
FIG. 8 shows a third modification example of the test apparatus 1 according to the present embodiment.

FIG. 8 shows a third modification example of the test apparatus 1 according to the present embodiment. In the test apparatus 1 according to the third modification example, the parts having the same function and configuration as those of the test apparatus 1 shown in FIG. 7 are provided with the same reference numerals, with the related description omitted except for the differences therebetween. In the present modification example, too, the control circuit 16 has the function of the determining part 22 of the determining section 14, the function of the controller 10 corresponding to the controller 10a, and the function of the test signal supplying section 11 corresponding to the test signal supplying section 11a. The calculating circuit 17, the memory 18, and the display 19 may be the same as their counterparts in the second modification example described above.

The signal processing circuit 35 may be a current/voltage converting circuit, a filter circuit such as a low pass filter, an attenuator, or an amplifier. The signal processing circuit 35 performs signal processing on the value of the inputted analogue output signal 102. The controller 10 adjusts the value of the analogue reference signal 201 outputted from the reference signal output section 12, according to the output section control signal 501 including the expected value of the test result output of the device under test 2. The controller 10 outputs the output section control signal 501 so that the output value of the difference calculating section 31 becomes the same as in any of the embodiments described above.

Moreover in the present modification example, the analogue output signal 102 outputted from the device under test 2 can be obtained by Expression 1 explained above. The other configurations may be the same as those of the embodiment shown in FIG. 1. In this way, according to the present modification example, the analogue output signal 102 outputted from the device under test 2 can be judged by using an AD converter 21 having a relatively low resolution performing signal processing on the analogue output signal 102, which is the test result output from the device under test 2.

Figure 9:
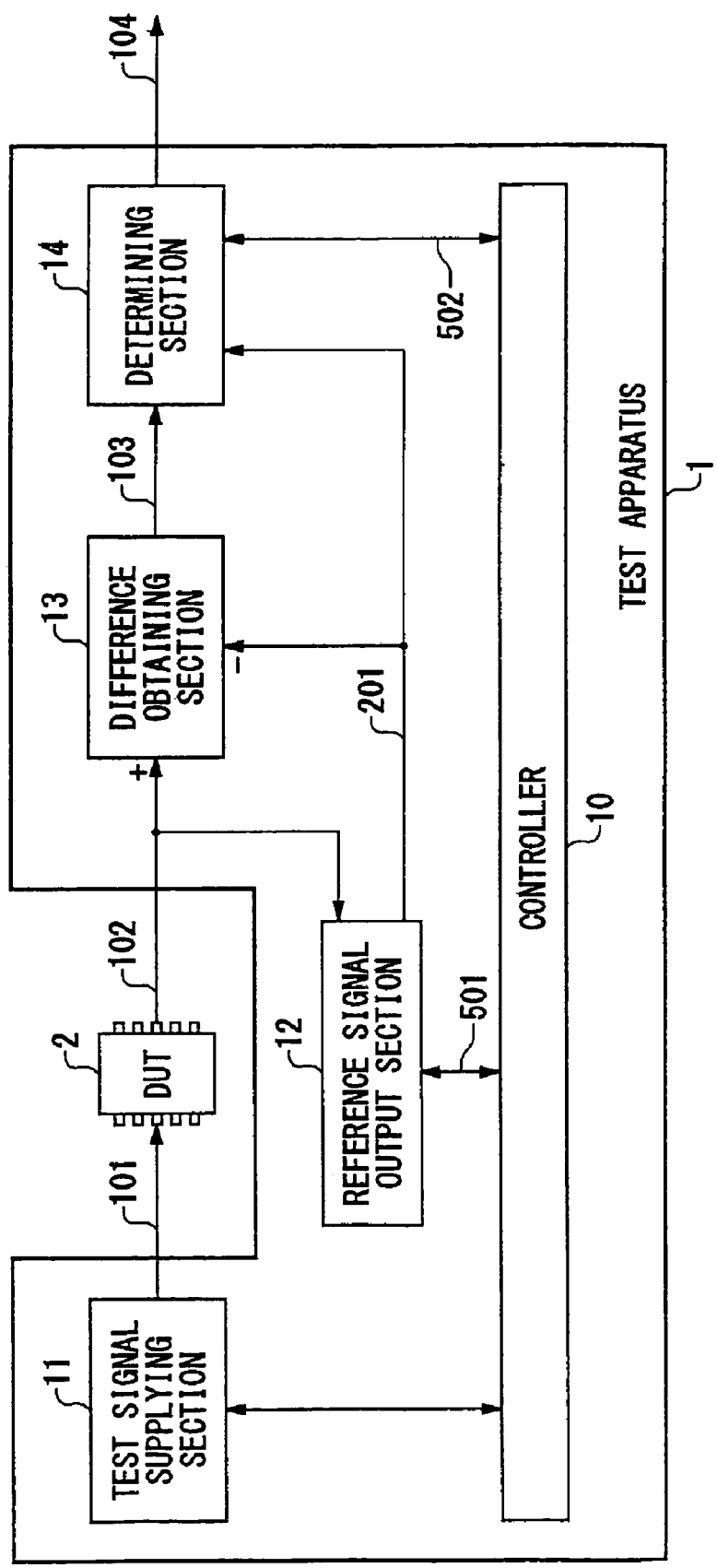
FIG. 9 shows another exemplary configuration of the test apparatus 1 according to the present embodiment.

FIG. 9 shows another exemplary configuration of the test apparatus 1 according to the present embodiment. In the test apparatus 1 according to the present example, the parts having the same function and configuration as those of the test apparatus 1 shown in FIGS. 1 through 8 are provided with the same reference numerals, with the related description omitted except for the differences therebetween.

The reference signal output section 12 in the present example receives, in advance, as an output section control signal 501, the expected value of the analogue reference signal 201 to be outputted from the reference signal output section 12 corresponding to each division range resulting from dividing the analogue output signal 102, and receives the analogue output signal 102. The reference signal output section 12 outputs the analogue reference signal 201, based on the actual analogue output signal 102, to the difference obtaining section 13 and to the determining section 14. The range determining section 41 in the present example (FIG. 2) determines in which of a plurality of division ranges, pre-set as in FIG. 5A, the analogue output signal 102 inputted from the device under test 2 is included, and outputs a range determining signal 601. The subsequent operations are the same as those of the embodiments described above, and so the description thereof is omitted.

The determining section 14 in the present example receives an analogue reference signal 201 from the reference signal output section 12, in addition to the analogue difference signal 103 from the difference obtaining section 13 and each expected value of the analogue output signal 102 from the controller 10. The determining section 14 determines whether the analogue output signal 102 outputted from the device under test 2 is defective or not, based on the analogue difference signal 103 and the analogue reference signal 201 having been inputted, and the expected value of the analogue output signal 102. In this way, according to the present embodiment, the reference signal output section 12 can determine the range of the test result output of the device under test 2 accurately, by using the analogue output signal 102 for generating a reference signal. Therefore, the determining section 14 can determine whether the analogue output signal 102 shows a defect or not, more accurately.

Figure 10:
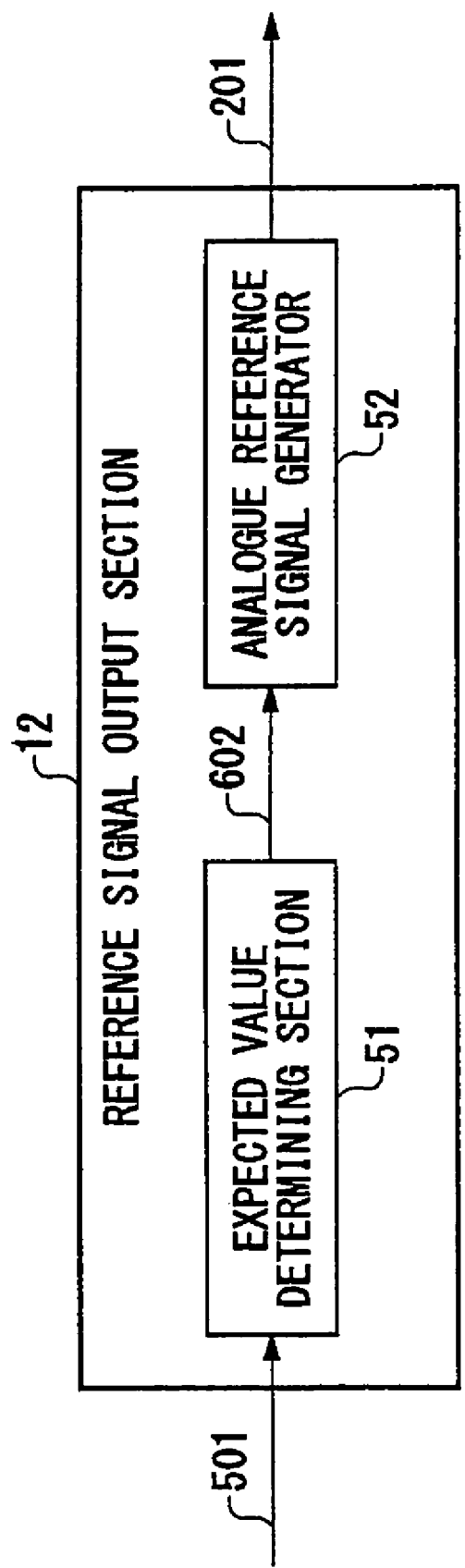
FIG. 10 shows a modification example of the reference signal output section 12 according to the present embodiment.

FIG. 10 shows a configuration of a modification example of the reference signal output section 12 according to the present embodiment. In the reference signal output section 12 according to the present modification example, the parts having the same function and configuration as those of the reference signal output section 12 are provided with the same reference numerals, with the related description omitted except for the differences therebetween. The test apparatus 1 according to the present modification example supplies a digital input signal 101 to the device under test 2, and determines whether the analogue output signal 102 shows a defect or not, based on a comparison result between the analogue output signal 102 outputted from the device under test 2 according to the digital input signal 101 and the expected value of the analogue output signal 102.

When outputting a digital input signal 101 for testing purposes to the device under test 2, the controller 10 in the present modification example includes the expected value Ve of the test result of the device under test 2 or the value in accordance with the expected value Ve in the output section control signal 501, and outputs the output section control signal 501 to the reference signal output section 12. The expected value Ve may, for example, be the value corresponding to the digital input signal 101 obtained in advance based on the required specification of the device under test 2.

The reference signal output section 12 in the present modification example includes an expected value determining section 51 and an analogue reference signal generator 52. The expected value determining section 51 receives the output section control signal 501 including the expected value Ve of the analogue output signal 102 to be outputted from the device under test 2 according to the digital input signal 101 for testing purposes. The expected value determining section 51 outputs a determination result 602 by determining the level of the expected value Ve from the output section control signal 501. For example, the expected value determining section 51 determines in which of the division ranges shown in FIG. 5A the digital input signal 101 is included, and outputs the determination result 602.

The analogue reference signal generator 52 generates an analogue reference signal 201 according to the expected value Ve based on the determination result 602 of the expected value determining section 51, and outputs the generated analogue reference signal 201. In addition, the analogue reference signal generator 52 may output the analogue reference signal 201 just as the analogue reference signal generator 42 shown in FIG. 2. The analogue reference signal generator 52 may convert the expected value Ve into an analogue value and output the converted value as the analogue reference signal 201.

Figure 11A:
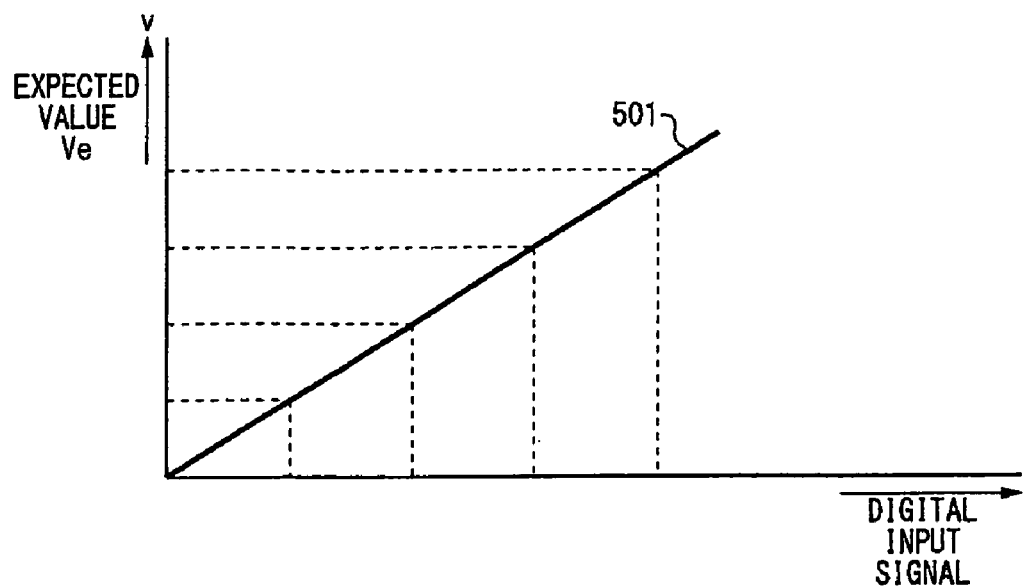
FIGS. 11A and 11B show an exemplary output of the modification example of the reference signal output section 12 and the difference obtaining section 13 according to the present embodiment.
Figure 11B:
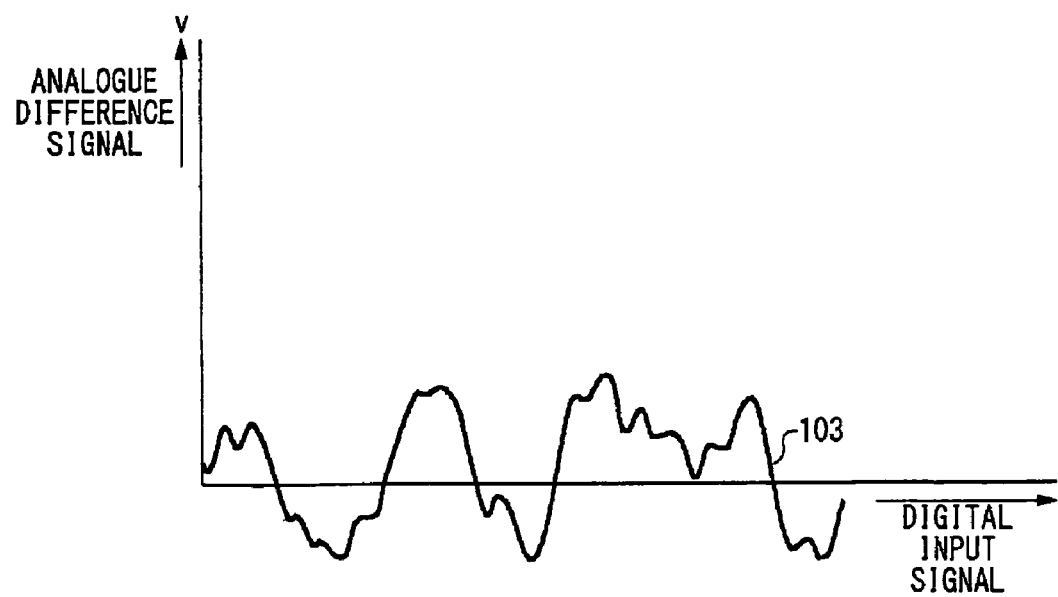

FIGS. 11A and 11B show an exemplary output of the modification example of the reference signal output section 12 and the difference obtaining section 13 according to the present embodiment. FIG. 11A shows the value of the digital input signal 101 on the horizontal axis, and the expected value Ve of the analogue output signal 102 on the vertical axis. The controller 10 includes the expected value Ve corresponding to the value of the digital input signal 101 in the output section control signal 501, and supplies the output section control signal 501 to the reference signal output section 12. The reference signal output section 12 sets the analogue reference signal 201 corresponding to the expected value Ve in advance. The analogue reference signal 201 corresponding to the expected value Ve may be obtained when the horizontal axis in FIG. 5A corresponds to the expected value Ve. When it receives the expected value Ve, the reference signal output section 12 outputs the analogue reference signal 201 corresponding to the received expected value Ve.

FIG. 11B shows the analogue difference signal 103 when the expected value Ve of the analogue output signal 102 is displaced according to the digital input signal value as shown in FIG. 11A. In FIG. 11B, the horizontal axis corresponds to the digital input signal value, and the vertical axis corresponds to the voltage V. In this case, the difference calculating section 31 outputs, as the analogue difference signal 401, an error component of the voltage value of the analogue output signal 102 with respect to the voltage value of the analogue reference signal 201 as shown in the drawing. The analogue difference signal 401 outputted from the difference calculating section 31 will be an analogue difference signal 103 after amplified by the amplifier 32.

The amplifier 32 outputs the amplified analogue difference signal 103 to the determining section 14. The subsequent operations are the same as those of the embodiments described above, with replacement of the voltage value Va in the embodiments described above with the expected value Ve, and so the description thereof is omitted. In this way, according to the present modification example, the determining part 22 can determine the analogue difference signal 103 by making use of the expected value for generating a reference signal.

Figure 12:
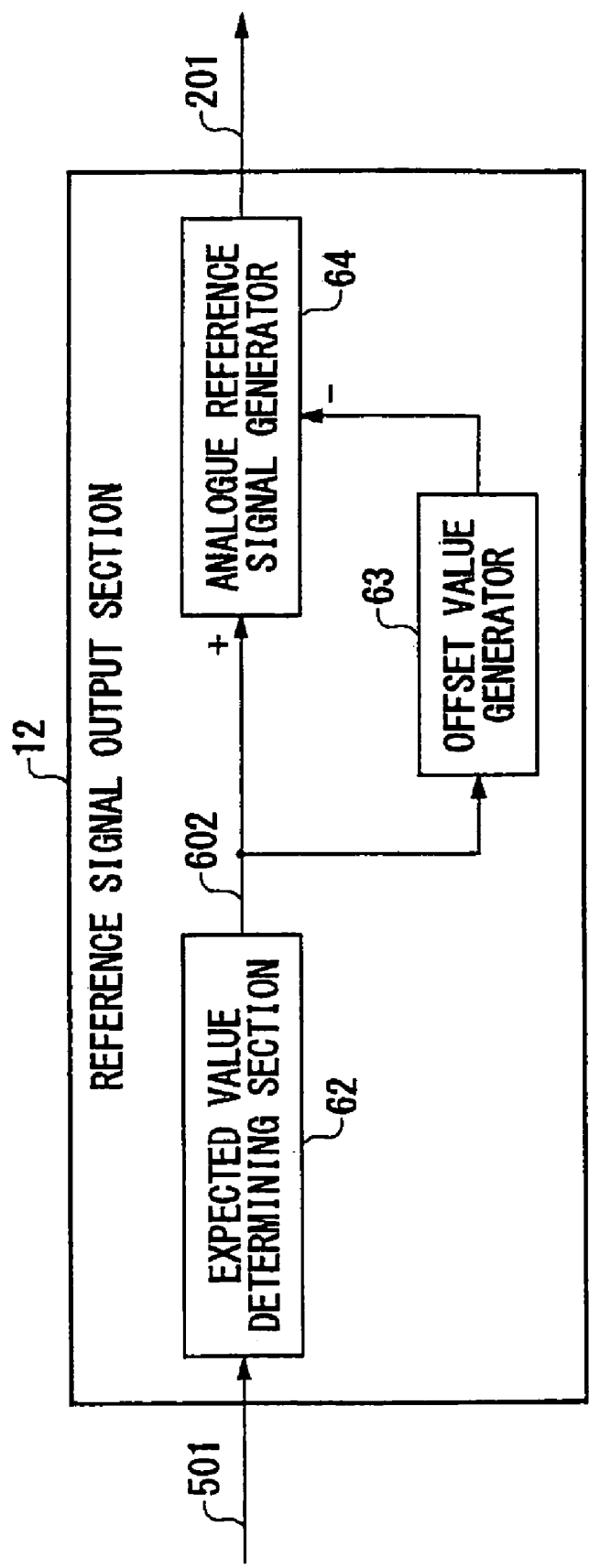
FIG. 12 shows another modification example of the reference signal output section 12 according to the present embodiment.

FIG. 12 shows another modification example of the reference signal output section 12 according to the present embodiment. In the reference signal output section 12 according to the present modification example, the parts having the same function and configuration as those of the reference signal output section 12 shown in FIG. 10 are provided with the same reference numerals, with the related description omitted except for the differences therebetween. The reference signal output section 12 in FIG. 12 outputs an analogue reference signal 201 from which an offset value is subtracted. In this case, the difference obtaining section 13 outputs an analogue difference signal 103 in which the center value is shifted towards the positive side from 0V Also in the present modification example, the controller 10 receives an expected value. The reference signal output section 12 includes an expected value determining section 62, an offset value generator 63, and an analogue reference signal generator 64. The expected value determining section 62 may output the determination result 602 just as the expected value determining section 51 in FIG. 10.

The offset value generator 63 may generate the offset value from the determination result 602, and output the generated offset value to the analogue reference signal generator 64. The offset value generator 63 may use a constant value as the offset value, or a value that varies according to the expected value. The offset value generator 63 may pre-store the offset value based on the required specification or the like of the device under test 2. An exemplary varying value is a value similar to the voltages Va1-Va4 shown in FIG. 5.

The analogue reference signal generator 64 may subtract the output of the offset value generator 63 from the determination result 602, for example. Accordingly, the analogue reference signal generator 64 outputs the analogue reference signal 201 resulting from shifting the center value of the expected value towards the negative side.

In this way, the reference signal output section 12 in the present modification example outputs an analogue reference signal 201 resulting from subtracting a predetermined offset value from an expected value. Then the analogue difference signal 103 outputted from the difference obtaining section 13 of the present modification example will be greater than that of the modification example of FIGS. 5B and 10B by the offset value. Accordingly, the determining section 14 can easily determine the analogue difference signal 103 only within the range of positive polarity.

Figure 13:
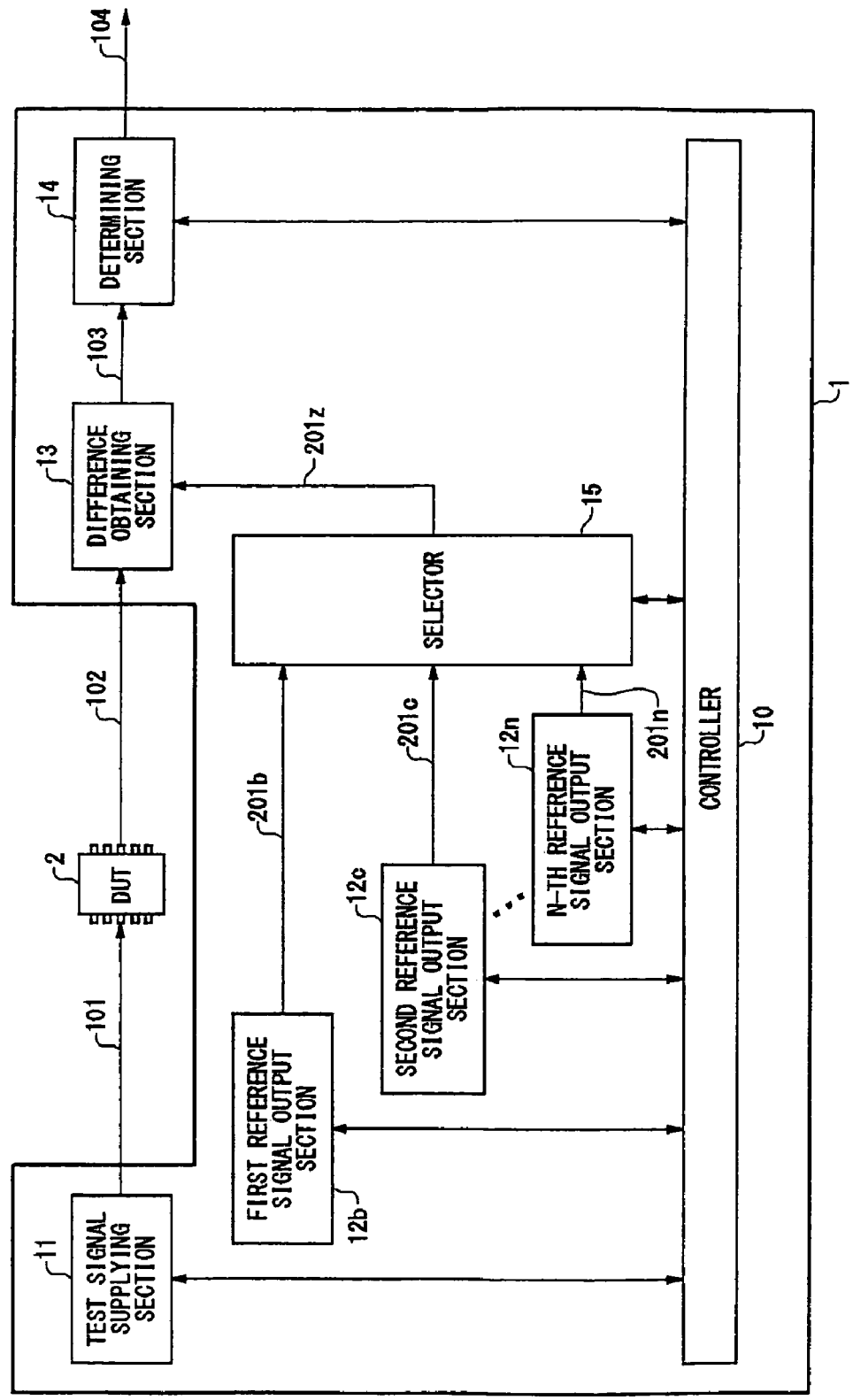
FIG. 13 shows a fourth modification example of the test apparatus 1 according to the present embodiment.

FIG. 13 shows a fourth modification example of the test apparatus 1 according to the present embodiment. In the test apparatus 1 according to the fourth modification example, the parts having the same function and configuration as those of the test apparatus 1 shown in FIG. 1 are provided with the same reference numerals, with the related description omitted except for the differences therebetween. The test apparatus 1 according to the fourth modification example includes, as the reference signal output section 12, a first reference signal output section 12$b$, a second reference signal output section 12$c$, . . . , and an n-th reference signal output section 12$n$, where "n" is a positive integer greater than 1. A selector 15 receives a first analogue reference signal 201$b$, a second analogue reference signal 201$c$, . . . , and an n-th analogue reference signal 201$n$ from a first reference signal output section 12$b$, a second reference signal output section 12$c$, . . . , and an n-th reference signal output section 12$n$, and outputs an analogue reference signal 201$z$ selected therefrom to the difference obtaining section 13.

The first reference signal output section 12$b$ supplies the first analogue reference signal 201$b$ to the difference obtaining section 13, during a test in which the first analogue output signal 102 is outputted from the device under test 2 in response to reception of the first digital input signal 101 for testing purposes. In parallel with this processing, the second reference signal output section 12$c$ prepares the second analogue reference signal 201$c$ corresponding to the second digital input signal 101 to be inputted to the device under test 2 next to the first digital input signal 101. In this case, the selector 15 first selects the first analogue reference signal 201$b$, and outputs it as the analogue reference signal 201$z$ to the difference obtaining section 13, and then selects the second analogue reference signal 201$c$, and outputs it as the analogue reference signal 201$z$ to the difference obtaining section 13.

Hereinafter, the selector 15 sequentially selects the first analogue reference signal 201$b$ through the n-th analogue reference signal 201$n$ in the same manner, and outputs the sequentially selected analogue reference signals as the analogue reference signal 201$z$ to the difference obtaining section 13. Note that preparation of the analogue reference signals 201$b$-$n$ by the reference signal output sections 12$b$-$n$ may be performed by such processing as settling to converge, to a predetermined value, the signal before being outputted, or stabilizing the signal before being outputted. In this way, according to the fourth modification example of the test apparatus 1, the second analogue reference signal 201$c$ can be prepared while the first analogue reference signal 201$b$ is supplied to the difference obtaining section 13, thereby improving the output speed of each analogue reference signal 201$b$-$n$.

Figure 14:
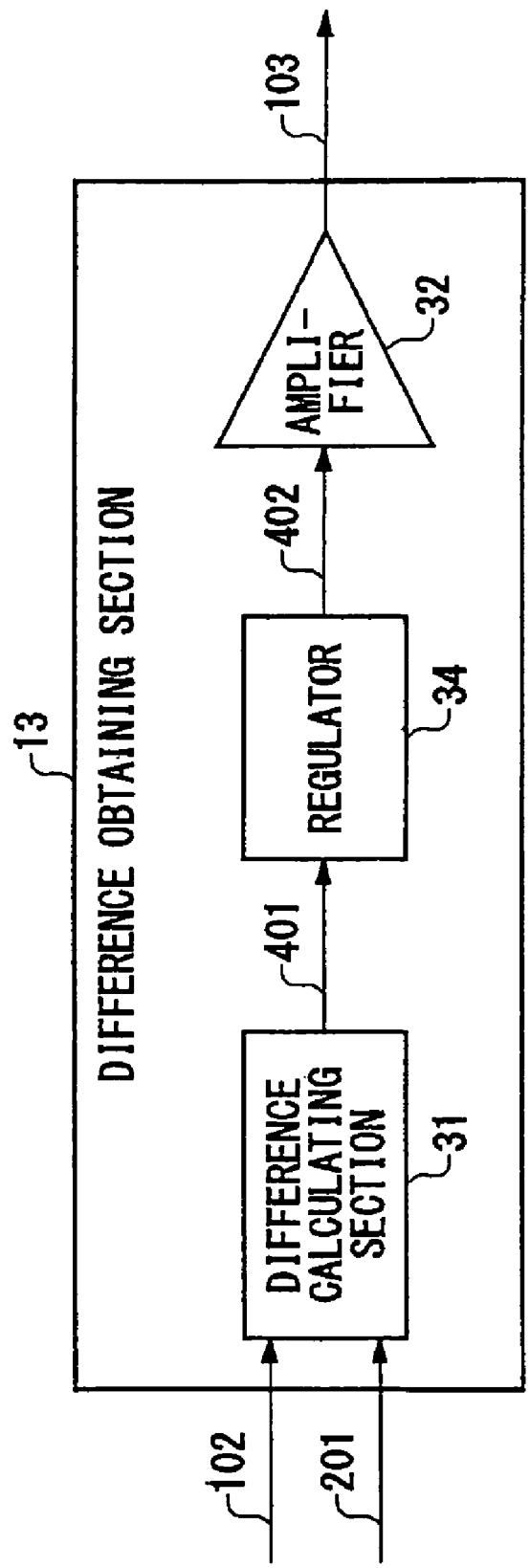
FIG. 14 shows a modification example of the difference obtaining section 13 according to the present embodiment.

FIG. 14 shows a modification example of the difference obtaining section 13 according to the present embodiment. In FIG. 14, the parts having the same function and configuration as those of the difference obtaining section 13 shown in FIG. 3 are provided with the same reference numerals, with the related description omitted except for the differences therebetween. The amplifier 32 is sometimes saturated when the input value goes beyond either the upper limit or the lower limit. In this case, the determining section 14 cannot appropriately determine the analogue difference signal 103 until the amplifier 32 is restored from the saturation state. The difference obtaining section 13 in the present modification example includes a regulator 34 for regulating the analogue difference signal 401 before amplification, so as to prevent the analogue difference signal 103 from going beyond the upper limit or the lower limit.

The regulator 34 regulates the value range of the analogue difference signal 103 within a predetermined range. Specifically, the regulator 34 regulates the value of the analogue difference signal 401 within a range defined by the upper limit and the lower limit within which the amplifier 32 will not be saturated. The regulator 34 can determine the regulation range based on the specification of the amplifier 32 for example, at the designing stage.

The regulator 34 may include therein a circuit for regulating the analogue difference signal 401. The regulating circuit may be formed by a semiconductor such as a diode having a clamping function. The regulating circuit may further be selected, to be set, from a plurality of regulating circuits having different regulation ranges from each other. In this way, according to the present modification example, the analogue difference signal 103 after amplification will not saturate, i.e. will not go beyond the upper limit or the lower limit, thereby allowing the determining section 14 to appropriately determine the analogue difference signal 103.

Although some aspects of the present invention have been described by way of exemplary embodiments, it should be understood that those skilled in the art might make many changes and substitutions without departing from the spirit and the scope of the present invention which is defined only by the appended claims.

The invention claimed is:

1. A test apparatus for testing a device under test, the test apparatus comprising:
   a test signal supplying section that supplies a digital input signal for testing purposes, to the device under test;
   a reference signal output section that outputs an analogue reference signal in accordance with the digital input signal;
   a difference obtaining section that outputs an analogue difference signal representing a difference between the analogue reference signal and an analogue output signal outputted by the device under test in accordance with the digital input signal; and
   a determining section that determines whether the analogue output signal shows a defect or not based on the analogue difference signal.

2. The test apparatus according to claim 1, wherein the determining section includes:
   an AD (analogue-to-digital) converter that converts the analogue difference signal into a digital difference signal, and
   a determining part that determines whether the analogue output signal shows a defect or not based on a value of the digital difference signal.

3. The test apparatus according to claim 2, wherein the analogue difference signal is obtained by amplifying the difference between the analogue output signal and the analogue reference signal.

4. The test apparatus according to claim 3, wherein the reference signal output section
   determines in which of a plurality of division ranges the digital input signal is included, the plurality of division ranges resulting from dividing a range of values that the digital input signal can take, and
   outputs the analogue reference signal determined corresponding to the division range in which the digital input signal is included.

5. The test apparatus according to claim 3, wherein the analogue reference signal is obtained in accordance with an expected value of the analogue output signal to be outputted from the device under test in accordance with the digital input signal.

6. The test apparatus according to claim 5, wherein the analogue reference signal is obtained by subtracting a predetermined offset value from the expected value.

7. The test apparatus according to claim 3, comprising:
   a plurality of reference signal output sections including a first reference signal output section and a second reference signal output section; and
   a selector that supplies an analogue reference signal outputted from a selected one of the reference signal output sections to the difference obtaining section, wherein
   while the first reference signal output section supplies a first analogue reference signal to the difference obtaining section during a test of a first analogue output signal in accordance with a first digital input signal for testing purposes, the second reference signal output section prepares a second analogue reference signal corresponding to a second digital input signal to be inputted to the device under test next to the first digital input signal.

8. The test apparatus according to claim 3, wherein the difference obtaining section includes a regulator that regulates a value range of the analogue difference signal to be within a predetermined range.

9. The test apparatus according to claim 3, wherein the test signal supplying section sequentially supplies a plurality of digital input signals to the device under test, where each digital input signal is such that each bit of the digital input signal is sequentially set to 1 while the other bits are set to 0, and
   the determining section determines that the device under test is defective when at least one of the plurality of digital input signals falls out of a predetermined error range.

10. A manufacturing method comprising:
    manufacturing a device under test; and
    selecting the manufactured device under test by testing the device under test using a test apparatus according to claim 1.

11. A test method for testing a device under test, the test method comprising:
    supplying a digital input signal for testing purposes, to the device under test;
    outputting an analogue reference signal in accordance with the digital input signal;
    outputting an analogue difference signal representing a difference between the analogue reference signal and an analogue output signal outputted by the device under test in accordance with the digital input signal; and
    determining whether the analogue output signal shows a defect or not based on the analogue difference signal.

* * * * *